United States Patent
Min et al.

(10) Patent No.: US 7,750,433 B2
(45) Date of Patent: Jul. 6, 2010

(54) PROBE-BASED MEMORY

(75) Inventors: Kyu S. Min, San Jose, CA (US); Nathan R. Franklin, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/370,450

(22) Filed: Feb. 12, 2009

(65) Prior Publication Data

US 2009/0146126 A1  Jun. 11, 2009

Related U.S. Application Data

(62) Division of application No. 11/392,102, filed on Mar. 28, 2006, now Pat. No. 7,498,655.

(51) Int. Cl.
*H01L 29/00* (2006.01)
(52) U.S. Cl. ........................ 257/529; 257/528; 257/530; 369/126; 369/127
(58) Field of Classification Search ................ 257/528, 257/529, 530; 369/13.01, 13.02, 126, 127
See application file for complete search history.

(56) References Cited

U.S. PATENT DOCUMENTS

| 5,248,632 | A | 9/1993 | Tung et al. |
| 5,426,614 | A | 6/1995 | Harward |
| 5,815,429 | A | 9/1998 | Sher et al. |
| 6,075,719 | A | 6/2000 | Lowrey et al. |
| 6,087,674 | A | 7/2000 | Ovshinsky et al. |
| 6,507,061 | B1 | 1/2003 | Hudgens et al. |
| 6,570,784 | B2 | 5/2003 | Lowrey |
| 6,625,054 | B2 | 9/2003 | Lowrey et al. |
| 6,687,153 | B2 | 2/2004 | Lowrey |
| 6,791,102 | B2 | 9/2004 | Johnson et al. |
| 7,027,364 | B2 | 4/2006 | Hong et al. |
| 7,259,988 | B2 | 8/2007 | Huang |
| 7,336,524 | B2 * | 2/2008 | Rust ..................... 365/151 |
| 2006/0117122 | A1 | 6/2006 | Hannah |

* cited by examiner

*Primary Examiner*—Phuc T Dang
(74) *Attorney, Agent, or Firm*—Schwabe, Williamson & Wyatt, P.C.

(57) ABSTRACT

Apparatuses, a method, and a system for a non-volatile, probe-based memory device are disclosed herein. In various embodiments, probe-based memory may be one-time programmable or rewritable nonvolatile probe-based memory.

7 Claims, 3 Drawing Sheets

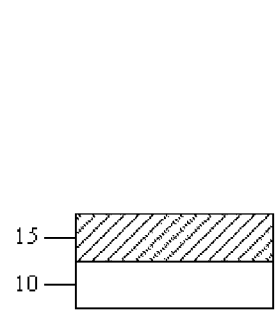
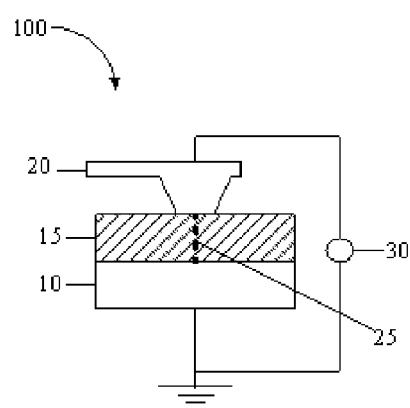
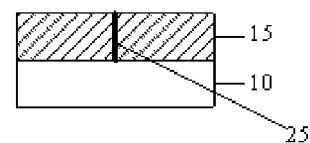
Figure 1A            Figure 1B            Figure 1C
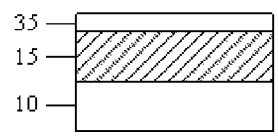
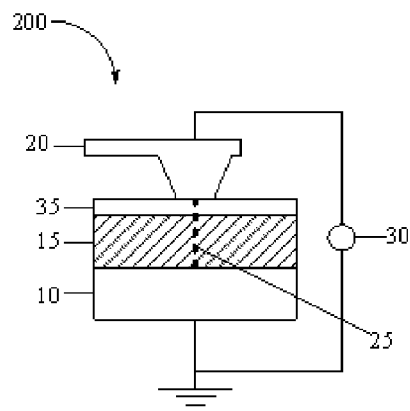
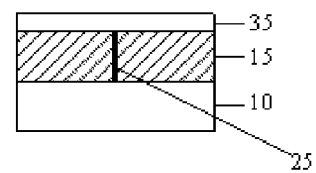
Figure 2A            Figure 2B            Figure 2C

PROBE-BASED MEMORY

CROSS REFERENCE TO RELATED APPLICATIONS

The present application is a divisional of U.S. patent application Ser. No. 11/392,102, filed Mar. 28, 2006 U.S. Pat. No. 7,498,655, entitled "PROBE-BASED MEMORY," which is hereby incorporated by reference in its entirety for all purposes except for those sections, if any, that are inconsistent with this specification.

TECHNICAL FIELD

Embodiments of the invention relate generally to the field of semiconductor processing, specifically to methods, apparatuses, and systems associated with or having non-volatile memory devices.

BACKGROUND

Increasingly, non-volatile memory devices are being employed for memory storage. These devices are capable of retaining stored memory even without the need of a power source. Examples of nonvolatile memory include one-time programmable read-only memory (memory that can be written once but cannot be erased once written) and rewritable memory (can be rewritten even after initial writing). In an ever more mobile society, nonvolatile memory has become an appealing technology.

Despite the appeal of nonvolatile memory devices, problems are associated with current methods of manufacturing these devices. For instance, with respect to one-time programmable memory devices, antifuse material has been used enlisting the use of field-induced antifuse formation; however, this method may have the drawback of current spread and/or insufficient current density for programming/reading. With respect to rewritable memory devices, when using electrically bi-stable materials, manufacturers have encountered the problem of current spreading and enlargement of bit size due to lack of precision control during writing/reading.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

FIGS. 1A-C illustrate a one-time programmable non-volatile probe-based memory device in accordance with various embodiments of the present invention;

FIGS. 2A-2C illustrate another embodiment of a one-time programmable non-volatile probe-based memory device in accordance with various embodiments of the present invention;

DETAILED DESCRIPTION OF EMBODIMENTS OF THE INVENTION

Figures 3A, 3B, 3C, 3D:
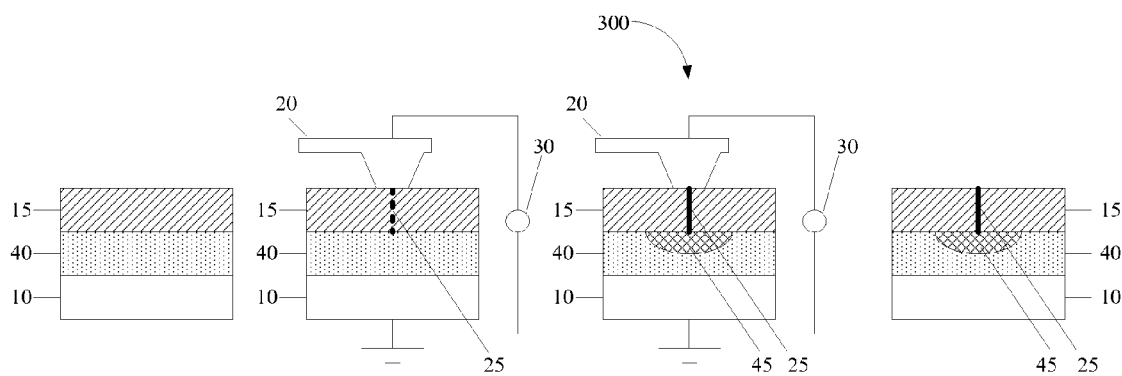
FIGS. 3A-3D illustrate a rewritable non-volatile probe-based memory device in accordance with various embodiments of the present invention.
Figures 4A, 4B, 4C, 4D:
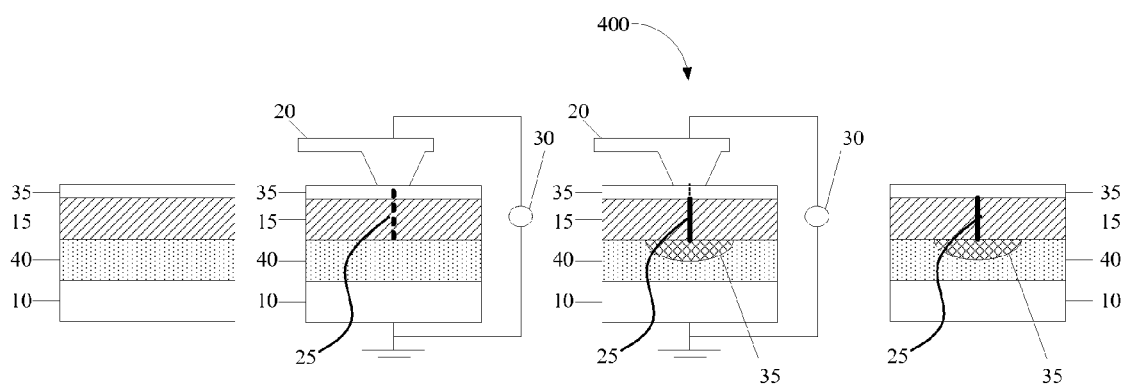
FIGS. 4A-4D illustrate another embodiment of a rewritable non-volatile probe-based memory device in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

FIGS. 1A-1C illustrate a one-time programmable (OTP) non-volatile probe-based memory device (hereinafter "OTP memory device") and a method for making the same in accordance with various embodiments of the present invention. In various ones of these embodiments, OTP memory device 100 may comprise an electrode layer 10, an antifuse material layer 15 disposed on top of the electrode layer 10, and an electrical probe 20 in electrical contact with the antifuse material layer 15 to create a conductive path 25 therein. In various embodiments, electrical probe 20 may be configured to be moveable in one or more directions relative to electrode layer 10 and antifuse material layer 15. In these embodiments, electrical probe 20, being moveable, may also remain in a stationary position relative to electrode layer 10 and antifuse material layer 15.

One or more voltage sources 30 may be coupled to the OTP memory device 100 in various embodiments in accordance with the present invention. In various embodiments, voltage source 30 may comprise a current source power supply or similar devices. In some embodiments, voltage source 30 may facilitate programming of the OTP memory device 100. For example, voltage source 30 may cause a current to flow between electrical probe 20 and electrode layer 10 in order to produce conductive path 25 in antifuse material layer 15. In addition or alternatively, voltage sources 30 may facilitate reading of the OTP memory device 100. In some of these embodiments, conductive path 25 in antifuse material layer 15 may be read by electrical probe 20, facilitated by voltage source 30. Reading by electrical probe 20 of conductive path 25 has a benefit of misregistration tolerance, i.e., electrical probe 20 need not be precisely centered over conductive path 25. Misregistration tolerance may be due in part to the relatively high conductivity of narrow conductive path 25 programmed by electrical probe 20, i.e., the current path is sharply focused. For example, in various embodiments of the present invention, electrical probe 20 may be configured to create a conductive path 25 having a width of ≦100 nanometers in the antifuse material layer 15. In some of these embodiments and in some applications, a conductive path 25 having a width of ≦5 nanometers may provide particularly desirable current focusing.

Referring now to antifuse material layer 15, antifuse material layer 15 may be formed using various materials in accordance with various embodiments of the present invention. In various embodiments, antifuse material layer 15 may be formed using an amorphous semiconductor. For example, antifuse material for antifuse material layer 15 may consist of amorphous polysilicon and/or amorphous carbon. Still further, in various embodiments, antifuse material layer 15 may be formed using a thin dielectric film. For example, in various ones of these embodiments, antifuse material for antifuse material layer 15 may consist of one of various oxides, including, for instance, silicon dioxide and aluminum oxide. In various other embodiments, antifuse material for antifuse material layer 15 may consist of one of various nitrides, including, for instance, aluminum nitride and silicon nitride.

Referring now to FIGS. 2A-2C, illustrated is an OTP memory device 200 in accordance with various embodiments of the present invention. In various ones of these embodiments, OTP memory device 200 may comprise a cap layer 35. In various ones of these embodiments, cap layer 35 may be disposed in between electrical probe 20 and antifuse material layer 15. Cap layer 35 may, in various embodiments, serve the purpose of providing frictional protection. For example, electrical probe 20 may cause damage to the surface of antifuse material layer 15 due to contact and/or movement across antifuse material layer 15 surface. Cap layer 35 may be disposed over antifuse material layer 15 in order to protect one or more of antifuse material layer 15 and electrical probe 20 from damage. In various ones of these embodiments, cap layer 35 may be selected from materials that minimize wear of antifuse material layer 15 and/or electrical probe 20. Further, in some embodiments, cap layer 35 may have a characteristic of a low friction coefficient with respect to electrical probe 20. In some embodiments, cap layer 35 may be formed from one or more materials including, for example, amorphous carbon, crystalline carbon, silicon carbide, as well as various oxides and nitrides. In some embodiments, cap layer 35 may be formed from one or more oxides including, for example, aluminum oxide, silicon dioxide, titanium oxide, hafnium oxide, or other oxides. In some embodiments, cap layer 35 may be formed from one or more nitrides including, for example, carbon nitride, boron nitride, silicon nitride, aluminum nitride, silicon oxynitride, titanium, titanium nitride, hafnium oxynitride, or other nitrides. In various other embodiments, cap layer 35 may comprise a lubricating material to reduce wear of antifuse material layer 15 and/or electrical probe 20.

Furthermore, cap layer 35 may have various electrical conductivity properties in accordance with various embodiments of the present invention. In various ones of these embodiments, cap layer 35 may have selected characteristics for providing a sufficient electrical focusing so that conductive path 25 may be formed in antifuse material layer 15. For instance, cap layer 35 may have a characteristic of asymmetrical electrical conductivity. Similarly, in various other embodiments, cap layer 35 may have an electronic tunneling property.

In some embodiments, antifuse material layer 15 may have characteristics of a desired quality so that cap layer 35 may not be necessary or desired (see, e.g., FIGS. 1A-1C, discussed previously). For example, antifuse material layer 15 having sufficient tribological qualities may vitiate necessity/desirability of cap layer 35. In various ones of these embodiments, antifuse material of antifuse material layer 15 may be comprised of a material that minimizes wear of antifuse material layer 15 and/or electrical probe 20. In various other embodiments, antifuse material of antifuse material layer 15 may be sufficiently wear-resistant so that an OTP memory device 100 or 200 has a desired longevity of use.

Referring now to FIGS. 3A-3D, illustrated is a rewritable non-volatile probe-based memory device (hereinafter "rewritable memory device") and a method for making the same in accordance with various embodiments of the present invention. In various ones of these embodiments, rewritable memory device 300 may comprise an electrode layer 10, an electrically bi-stable material layer 40 disposed on top of electrode layer 10, an antifuse material layer 15 disposed on top of the electrically bi-stable material layer 40. Further, in various ones of these embodiments, rewritable memory device 300 may comprise an electrical probe 20 in electrical contact with the antifuse material layer 15 to create a conductive path 25 in antifuse material layer 15. Electrical probe 20 may also cause, in various embodiments, an electrical resistance change 45 in at least a portion of electrically bi-stable material layer 40 (discussed below). In various embodiments, electrical probe 20 may be configured to be moveable in one or more directions relative to electrode layer 10, electrically bi-stable material layer 40, and antifuse material layer 15. In these embodiments, electrical probe 20, being moveable, may also remain in a stationary position relative to electrode layer 10, electrically bi-stable material layer 40, and antifuse material layer 15

One or more voltage sources 30 may be coupled to the rewritable memory device 45 in various embodiments in accordance with the present invention. In some of these embodiments, voltage source 30 may facilitate writing of a memory bit in the rewritable memory device 300. For example, voltage source 30 may cause a current to flow between electrical probe 20 and electrode layer 10 in order to produce conductive path 25 in antifuse material layer 15. Thereafter, in various embodiments, voltage source 30 may provide current, which is focused by conductive path 25 to electrically bi-stable material layer 40, to write to rewritable memory device 300, i.e., causing an electrical resistance change 45 in electrically bi-stable material layer 40. An electrical resistance change 45 in an electrically bi-stable material 40 may comprise a change in electrical resistance of electrically bi-stable material layer 40. In various embodiments, electrical resistance change 45 in electrically bi-stable material layer 40 may occur in a portion of electrically bi-stable material layer 40 having contact with conductive path 25.

In addition, voltage source 30 may facilitate reading of a memory bit in a rewritable memory device 300. In some of these embodiments, conductive path 25 in antifuse material layer 15 may be registered by electrical probe 20, facilitated by voltage source 30. As discussed previously, registration (or reading in the case of OTP memory device 100 or 200) by electrical probe 20 of conductive path 25 has a benefit of misregistration tolerance, i.e., electrical probe 20 need not be precisely centered over conductive path 25. Misregistration tolerance may be due in part to the relatively high conductivity of narrow conductive path 25 formed by electrical probe 20, i.e., the current path is sharply focused. For example, in various embodiments of the present invention, electrical probe 20 may be configured to create a conductive path 25 having a width of ≦5 nanometers in the antifuse material layer 15.

Referring now specifically to electrically bi-stable material layer 40, electrically bi-stable material layer 40 may be variously formed. For example, electrically bi-stable material layer 40 may be formed using various phase-change materials (e.g., chalcogenide). In various other embodiments in accordance with the present invention, any electrically bi-stable material known in the art may be used to form electrically bi-stable material layer 40.

Furthermore, antifuse material layer 15 may be formed using various materials in accordance with various embodiments of the present invention. In various embodiments, antifuse material layer 15 may be formed using any material that exhibits a pseudo-stable resistance below a threshold level of current, but exhibits a permanent increase in resistance after exposure to a level of current beyond the threshold. For example, in various embodiments, antifuse material layer 15 may be formed using an amorphous semiconductor. For example, antifuse material for antifuse material layer 15 may consist of amorphous polysilicon and/or amorphous carbon. Still further, in various embodiments, antifuse material layer 15 may be formed using a thin dielectric film. For example, in various ones of these embodiments, antifuse material for antifuse material layer 15 may consist of one of various oxides, including, for instance, silicon dioxide and aluminum oxide. In various other embodiments, antifuse material for antifuse material layer 15 may consist of one of various nitrides, including, for instance, aluminum nitride and silicon nitride. Still further, in various embodiments, antifuse material layer 15 may be formed using diamond and/or insulating carbides such as silicon carbide. It should be noted that the foregoing examples of materials suitable for antifuse material layer 15 are illustrative and are not meant to limit the scope of materials that may be used to form antifuse material layer 15.

Referring now to FIGS. 4A-4D, illustrated is a rewritable memory device 400 in accordance with various embodiments of the present invention. In various ones of these embodiments, rewritable memory device 400 may comprise a cap layer 35. In various ones of these embodiments, cap layer 35 may be disposed in between electrical probe 20 and antifuse material layer 15. Cap layer 35 may, in various embodiments, serve the purpose of providing frictional protection. For example, electrical probe 20 may cause damage to the surface of antifuse material layer 15 due to contact and/or movement across antifuse material layer 15 surface. Cap layer 35 may be disposed over antifuse material layer 15 in order to protect antifuse material layer 15 from damage. In various ones of these embodiments, cap layer 35 may be selected from materials that minimize wear of antifuse material layer 15 and/or electrical probe 20. Further, in some embodiments, cap layer 35 may have a characteristic of a low friction coefficient lower with respect to electrical probe 20. In some embodiments, cap layer 35 may be formed from one or more materials including, for example, amorphous carbon, crystalline carbon, silicon carbide, as well as various oxides and nitrides. In some embodiments, cap layer 35 may be formed from one or more oxides including, for example, aluminum oxide, silicon dioxide, titanium oxide, hafnium oxide, or other oxides. In some embodiments, cap layer 35 may be formed from one or more nitrides including, for example, carbon nitride, boron nitride, silicon nitride, aluminum nitride, silicon oxynitride, titanium, titanium nitride, hafnium oxynitride, or other nitrides. In various other embodiments, cap layer 35 may comprise a lubricating material to reduce wear of antifuse material layer 15 and/or electrical probe 20.

Furthermore, cap layer 35 may have various electrical conductivity properties in accordance with various embodiments of the present invention. In various ones of these embodiments, cap layer 35 may have selected characteristics for providing a sufficient electrical focusing so that conductive path 25 may be formed in antifuse material layer 15. For instance, cap layer 35 may have a characteristic of asymmetrical electrical conductivity. Similarly, in various other embodiments, cap layer 35 may have an electronic tunneling property.

In some embodiments, antifuse material layer 15 may have characteristics of a desired quality so that cap layer 35 may not be necessary or desired (see, e.g., FIGS. 3A-3D, discussed previously). For example, antifuse material layer 15 having sufficient tribological qualities may vitiate necessity/desirability of cap layer 35. In various ones of these embodiments, antifuse material of antifuse material layer 15 may be comprised of a material that minimizes wear of antifuse material layer 15 and/or electrical probe 20. In various other embodiments, antifuse material of antifuse material layer 15 may sufficiently wear-resistant so that a rewritable memory device has a desired longevity of use.

Figure 5:
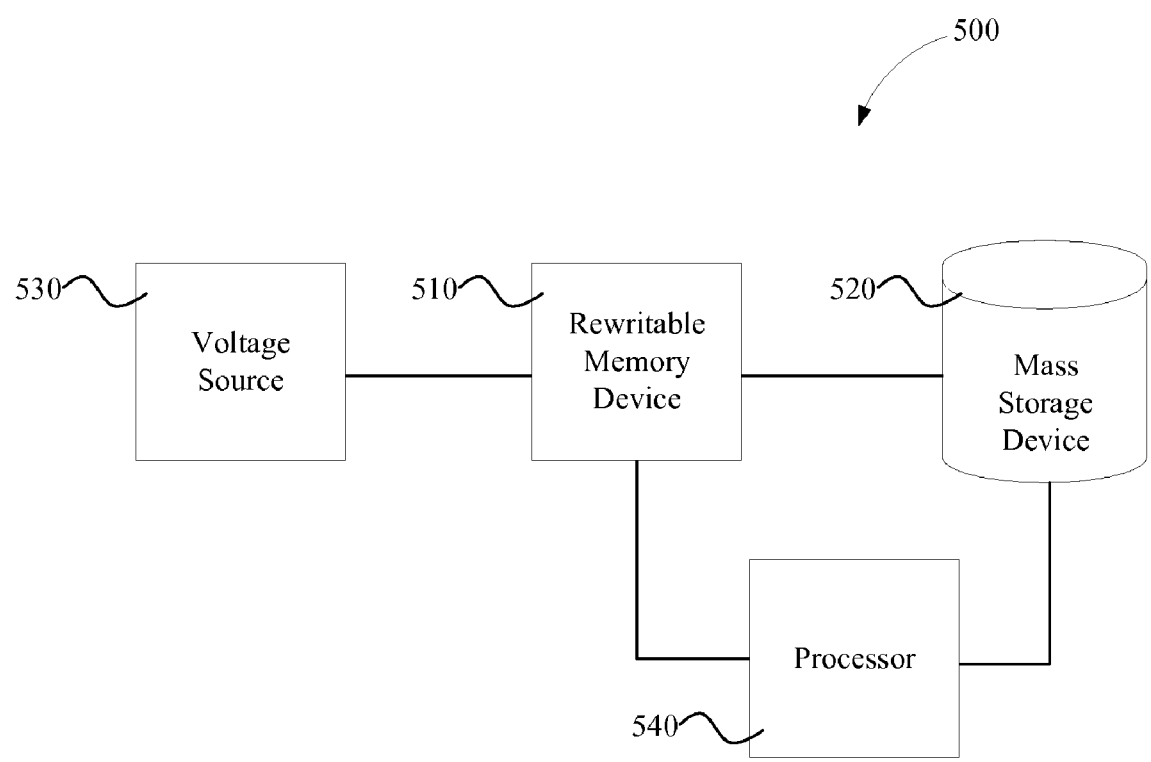
FIG. 5 illustrates a system incorporated with a rewritable non-volatile probe-based memory device in accordance with various embodiments of the present invention.

Illustrated in FIG. 5 is a system in accordance with various embodiments of the present invention. As shown, system 500 may comprise a rewritable memory device 510, one or more voltage sources 530 coupled to rewritable memory device 510, a mass storage 520, and a processor 530 coupled to rewritable memory device 510 and mass storage 520. With respect to voltage sources 530, depending on the applications, system 500 may comprise one or more voltage sources 530 to write and/or read the rewritable memory device 510. Mass storage 520 and processor 530 represent a broad range of these elements known in the art. System 500 may be embodied in a broad range of form factors from servers, to desktop, laptop, tablet, and/or handheld. System 500 may be endowed with various operating systems and/or applications to solve various computing problems.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A rewritable non-volatile probe-based memory device comprising:

an electrode layer;

an electrically bi-stable material layer disposed on top of the electrode layer;

an antifuse material layer disposed on top of the electrically bi-stable material layer;

an electrical probe in electrical contact with the antifuse material layer to create a conductive path therein; and a cap layer disposed in between the electrical probe and the antifuse material layer.

2. The apparatus of claim 1, wherein the electrically bi-stable material is chalcogenide.

3. The apparatus of claim 1, wherein the antifuse material is selected from the group consisting of amorphous silicon, amorphous carbon, diamond, insulating carbide, $SiO_2$, $Al_2O_3$, AlN, and $Si_3N_4$.

4. The apparatus of claim 1, wherein the antifuse material is wear-resistant.

5. The apparatus of claim 1, wherein the cap layer has one or more characteristics selected from wear-resistance, an asymmetrical electrical conductivity, and an electronic tunneling property.

6. The apparatus of claim 1, wherein the electrical probe is configured to create a conductive path having a width of $\leq 100$ nanometers in the antifuse material.

7. The apparatus of claim 1, wherein the electrical probe is configured to be moveable in one or more directions relative to the electrode layer, the electrically bi-stable material layer, and the antifuse material layer.

* * * * *